United States Patent
Sunohara et al.

(10) Patent No.: US 7,655,956 B2
(45) Date of Patent: Feb. 2, 2010

(54) SEMICONDUCTOR DEVICE AND METHOD FOR MANUFACTURING THE SAME

(75) Inventors: Masahiro Sunohara, Nagano (JP); Mitsutoshi Higashi, Nagano (JP); Yuichi Taguchi, Nagano (JP); Hideaki Sakaguchi, Nagano (JP); Akinori Shiraishi, Nagano (JP); Naoyuki Koizumi, Nagano (JP); Kei Murayama, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 55 days.

(21) Appl. No.: 11/644,933

(22) Filed: Dec. 26, 2006

(65) Prior Publication Data
US 2007/0145400 A1   Jun. 28, 2007

(30) Foreign Application Priority Data
Dec. 27, 2005   (JP)   ............................ P2005-375901

(51) Int. Cl.
*H01L 33/00* (2006.01)
(52) U.S. Cl. ............................ 257/98; 257/99; 257/100; 438/26; 438/29
(58) Field of Classification Search .................... 438/26, 438/28, 119; 257/98, 8, 99, 100; 362/328

See application file for complete search history.

(56) References Cited

U.S. PATENT DOCUMENTS

| 7,489,031 | B2 * | 2/2009 | Roberts et al. | 257/687 |
| 2004/0001324 | A1 * | 1/2004 | Ho et al. | 361/761 |
| 2004/0207999 | A1 * | 10/2004 | Suehiro et al. | 362/84 |
| 2007/0120463 | A1 * | 5/2007 | Hayashi et al. | 313/501 |
| 2008/0025030 | A9 * | 1/2008 | Lee et al. | 362/310 |

FOREIGN PATENT DOCUMENTS
JP   11-177136   7/1999

* cited by examiner

Primary Examiner—Fernando L Toledo
Assistant Examiner—Mamadou Diallo
(74) Attorney, Agent, or Firm—Drinker Biddle & Reath LLP

(57) ABSTRACT

There is provided a semiconductor device mounted with a light emitting element, which can be downsized easily, improve light emitting efficiency and be formed easily, and a method for manufacturing the semiconductor device effectively. The semiconductor device includes a substrate, a light emitting element mounted on the substrate by flip chip bonding, a sealing structure sealing the light emitting element and a phosphor film which is formed on an internal surface of the sealing structure. The sealing structure includes a blocking portion which is formed integrally with the substrate so as to surround the light emitting element on the substrate and functions as a reflector that reflects a light emitted from the light emitting element and a cover portion which is arranged on the top of the blocking portion and is bonded to the blocking portion.

10 Claims, 15 Drawing Sheets

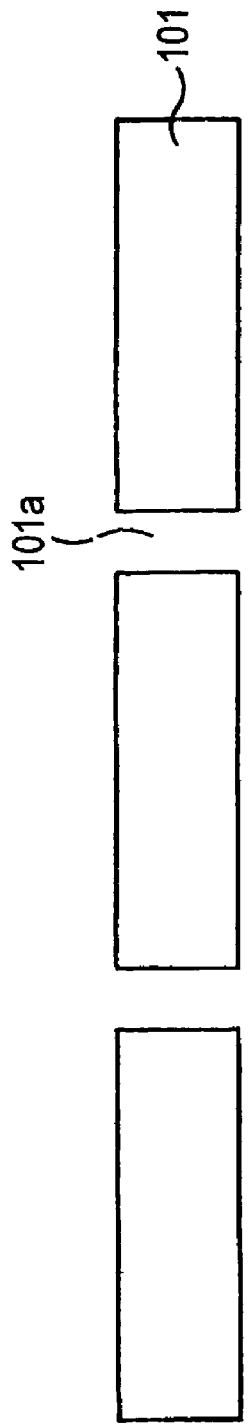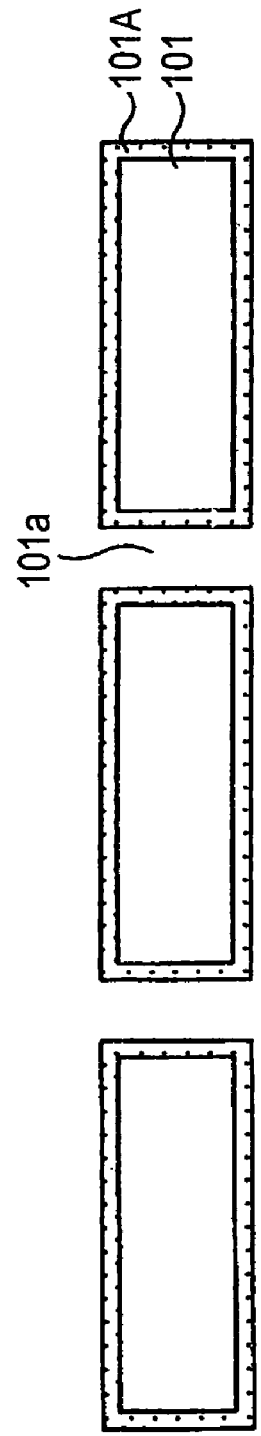

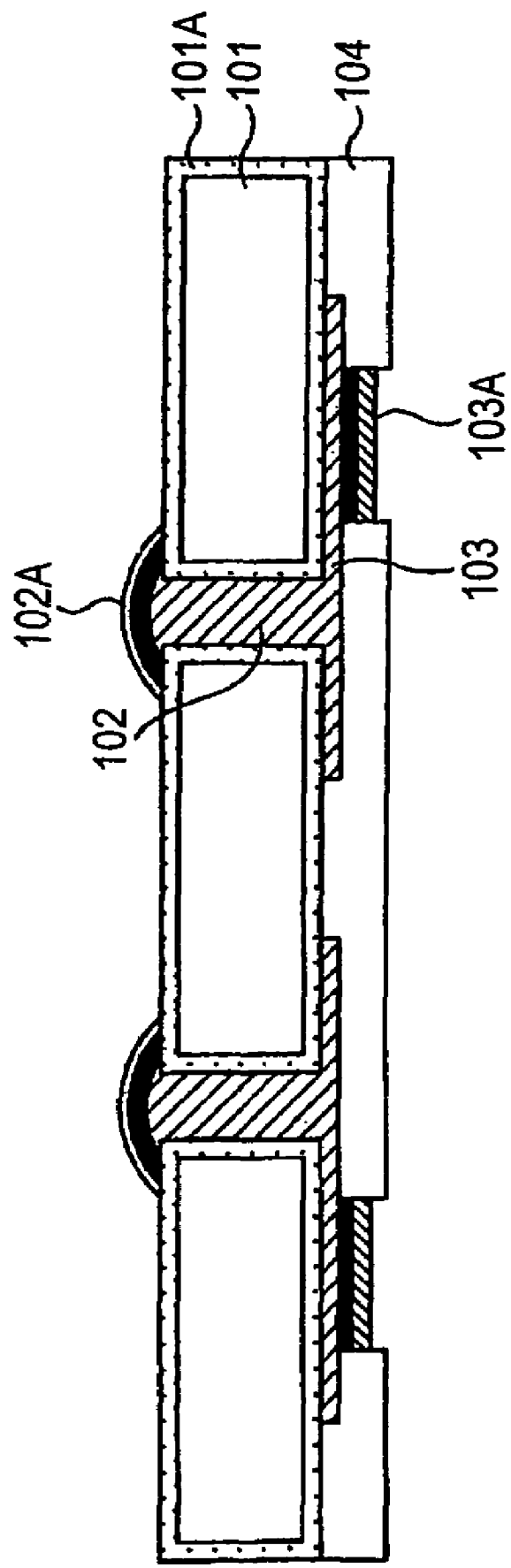

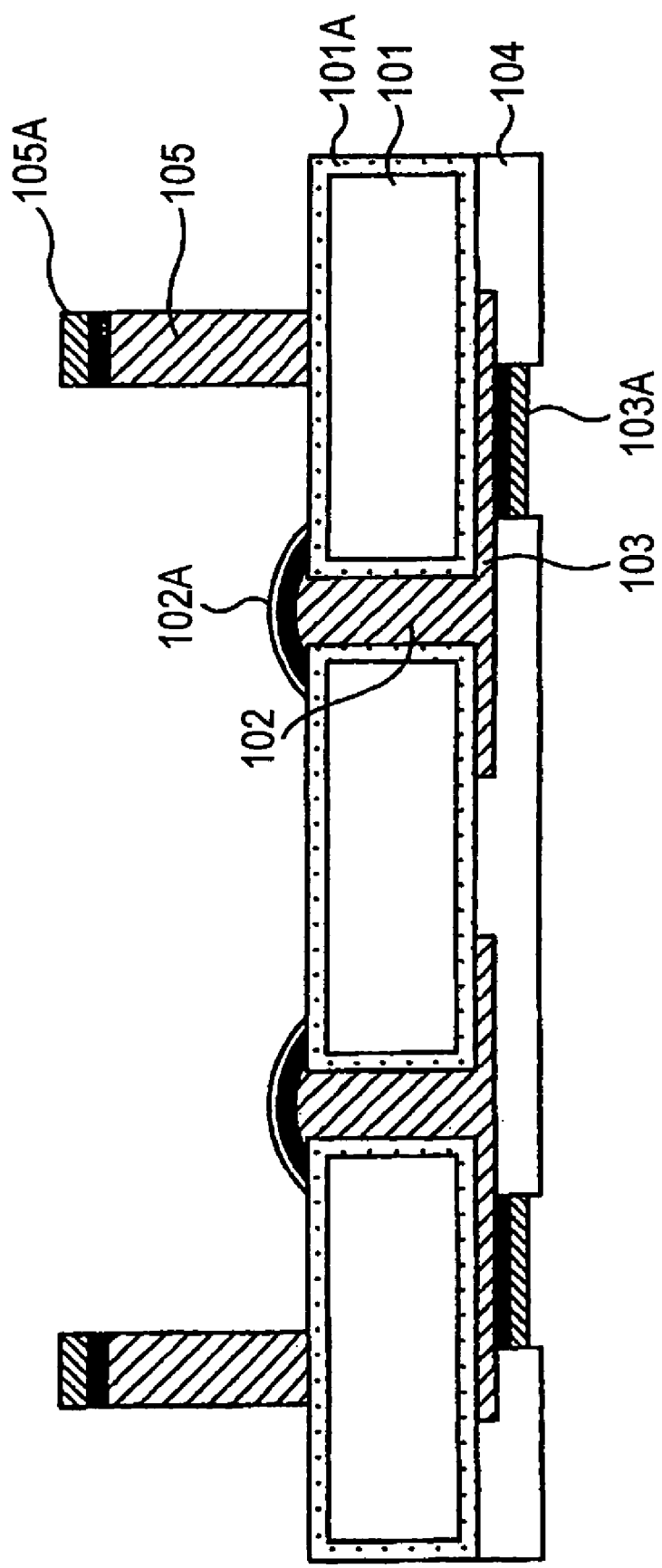

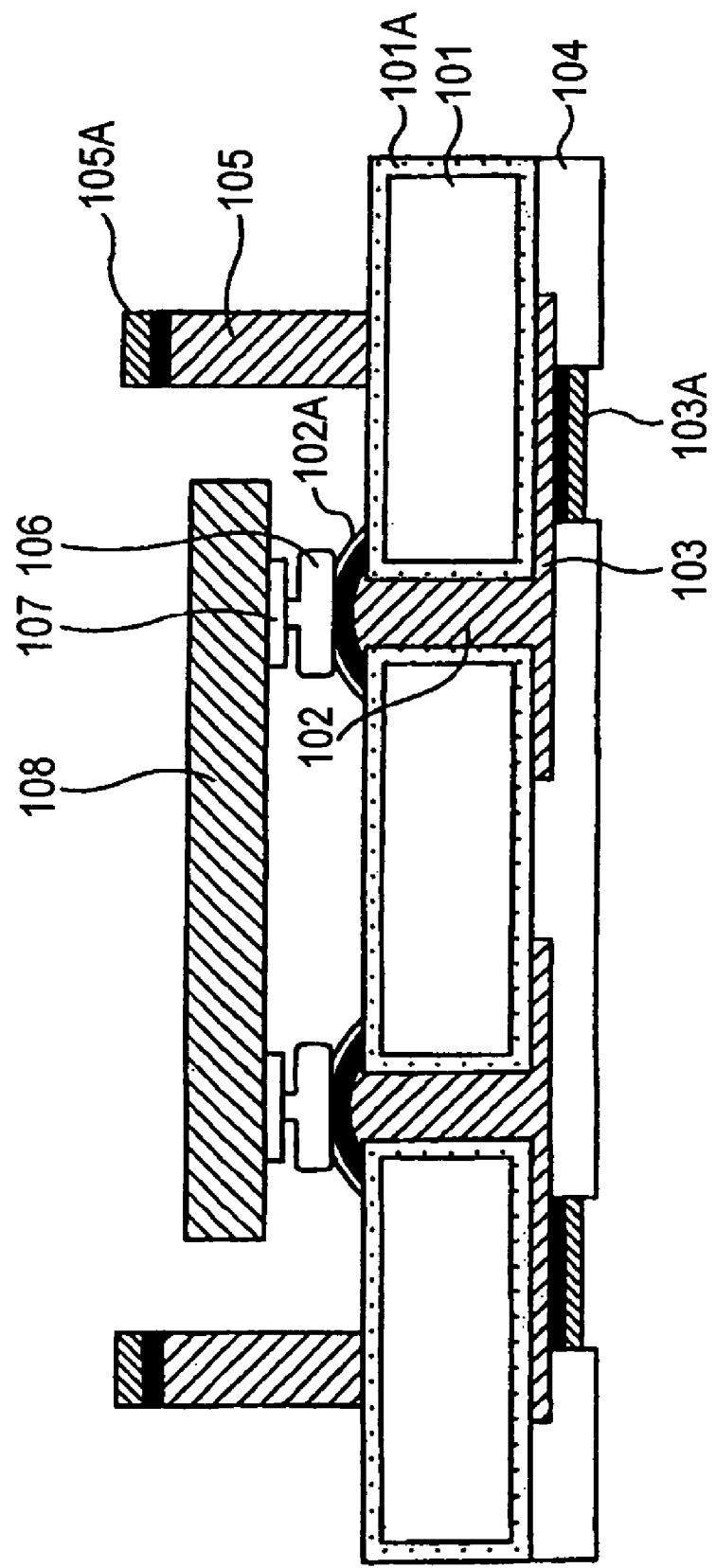

SEMICONDUCTOR DEVICE AND METHOD FOR MANUFACTURING THE SAME

This application claims priority from Japanese Patent application No. 2005-375901, filed Dec. 27, 2005, the contents of which is incorporated herein by reference in its entirety.

BACKGROUND OF THE INVENTION

1. Field of the Invention

The present invention relates to a semiconductor device having a substrate mounted with a light emitting element and a method for manufacturing the semiconductor device.

2. Description of the Related Art

Recently, various structures have been proposed as a semiconductor device having a substrate mounted with a light emitting element. For example, as an example of a semiconductor device mounted with a light emitting element, a semiconductor device mounted with a light emitting diode (LED) as described in JP-A-H11-177136 has been proposed.

FIG. 1 is a cross-sectional view showing a frame format of a semiconductor device 10 mounted with the LED as a light emitting element 14. Referring to FIG. 1, the semiconductor device 10 includes a structure having a substrate 11 mounted with the light emitting element 14.

In addition, the substrate 11 is formed with wirings 12, 13 that extend from one side of the substrate, where the light emitting element 14 is mounted, to the opposite side of the substrate. The light emitting element 14 is arranged to be connected to the wirings 12, 13 respectively through wires 15, 16.

Further, a cavity 17 is formed on the substrate 11, and the light emitting element 14 is arranged in a concave portion of the cavity 17. If an internal surface 17a of the cavity 17 is coated with a metal plating, it is possible to use the internal surface as a reflector.

If necessary, it is possible to use a combination of LED light emitted and phosphor light emitted so as to obtain desired light emitting color by coating a phosphor film on the light emitting element 14.

However, the semiconductor device has the following problems. In the semiconductor device, the light emitting element is connected to the substrate through the wires. For this reason, a space is needed for bonding wires. As the result, a problem is caused in that it becomes difficult to downsize the semiconductor device.

Further, when a reflector is formed in the semiconductor device or when a phosphor film is formed in the semiconductor device, it is necessary to form the reflector and the phosphor film in every package respectively. As a result, there have been such problems that not only the structure of the semiconductor device is complex, but also it is difficult to form a structure to improve light emitting efficiency.

SUMMARY OF THE INVENTION

The invention is accomplished in view of the above problems. Objects of the present invention are to provide a novel and useful semiconductor device, and a method for manufacturing the semiconductor device, which solve the above-mentioned problems.

More specifically, objects of the present invention are to provide a semiconductor device mounted with a light emitting element, which can be downsized easily, improve light emitting efficiency and be formed easily, and a method for manufacturing the semiconductor device effectively.

In a first aspect of the present invention, the above-mentioned problems can be solved by providing a semiconductor device comprising a substrate, a light emitting element mounted on the substrate by flip chip bonding and a sealing structure sealing the light emitting element, wherein the sealing structure includes a blocking portion which is formed to surround the light emitting element on the substrate through plating and is bonded to a cover portion which is arranged on top of the blocking portion. A phosphor film is also formed on an internal surface of the sealing structure and the blocking portion functions as a reflector that reflects a light emitted from the light emitting element.

The semiconductor device is able to be downsized easily, to improve light emitting efficiency and to be formed easily.

When the light emitting element is an LED, it is preferable that a desired light emitting color can be obtained by combining of an LED light emission and a phosphor light emission.

When the semiconductor device includes a through wiring which is formed to pass through the substrate and is electrically connected to the light emitting element, the light emitting element can be easily connected to a connection object.

When a bonding portion of the cover portion, which is bonded to the blocking portion, is formed by patterning, the cover portion can be easily bonded to the blocking portion. Further, in a second aspect of the present invention, the above-mentioned problems can be solved by providing a method for manufacturing a semiconductor device in which a light emitting element mounted on a substrate is sealed, said method comprises steps of forming a blocking portion on the substrate through plating, mounting the light emitting element by flip chip bonding in a region surrounded by the blocking portion on the substrate, coating a phosphor film on an internal surface of a sealing structure and sealing the light emitting element by bonding a cover portion coated with a phosphor film to the blocking portion.

According to the method for manufacturing the semiconductor device, it is possible to effectively manufacture the semiconductor device mounted with a light emitting element, which can be downsized easily and improves light emitting efficiency.

Further, when the light emitting element is an LED, it is preferable that a desired light emitting color can be obtained by combining an LED light emission and a phosphor light emission.

When the method for manufacturing the semiconductor device further comprises a step of forming a through wiring which is formed to pass through the substrate, wherein the light emitting element is mounted to be connected to the through wiring, it is possible to manufacture the semiconductor device in which the light emitting element can be easily connected to a connection object.

When the blocking portion functions as a reflector that reflects a light emitted from the light emitting element, the light emitting efficiency of the semiconductor device can be improved.

When a bonding portion of the cover portion, which is bonded to the blocking portion, is formed by patterning, the cover portion can be easily bonded to the blocking portion.

According to the present invention, it is possible to provide a semiconductor device mounted with a light emitting element, which can be downsized easily, improve light emitting efficiency and also be formed easily, and a method for manufacturing the semiconductor device effectively.

BRIEF DESCRIPTION OF THE DRAWINGS

FIG. 3C is a diagram illustrating a third process step for fabricating the semiconductor device shown in FIG. 2;

FIG. 3D is a diagram illustrating a fourth process step for fabricating the semiconductor device shown in FIG. 2;

FIG. 3G is a diagram illustrating a seventh process step for fabricating the semiconductor device shown in FIG. 2;

FIG. 3H is a diagram illustrating an eighth process step for fabricating the semiconductor device shown in FIG. 2;

FIG. 3J is a diagram illustrating a tenth process step for fabricating the semiconductor device shown in FIG. 2;

DETAILED DESCRIPTION OF EXEMPLARY EMBODIMENTS

Exemplary embodiments of the present invention will hereinafter be described in detail by reference to the accompanying drawings.

Figure 1:
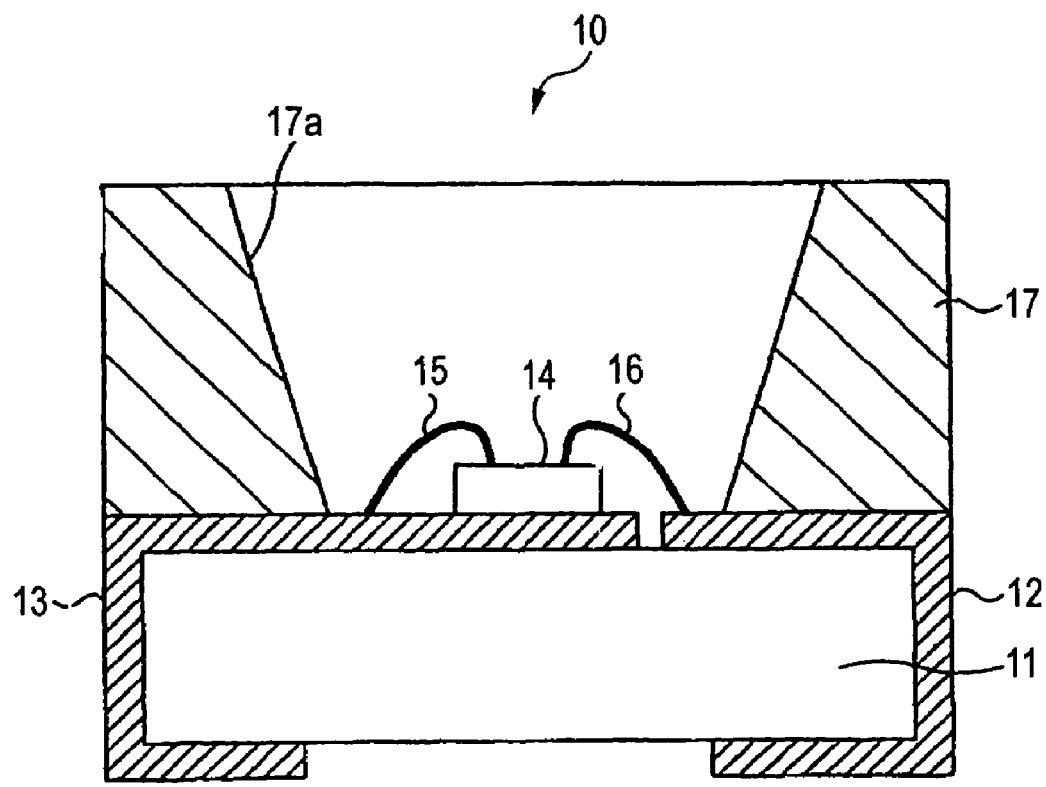
FIG. 1 is an example of a semiconductor device structure according to the related art.
Figure 2:
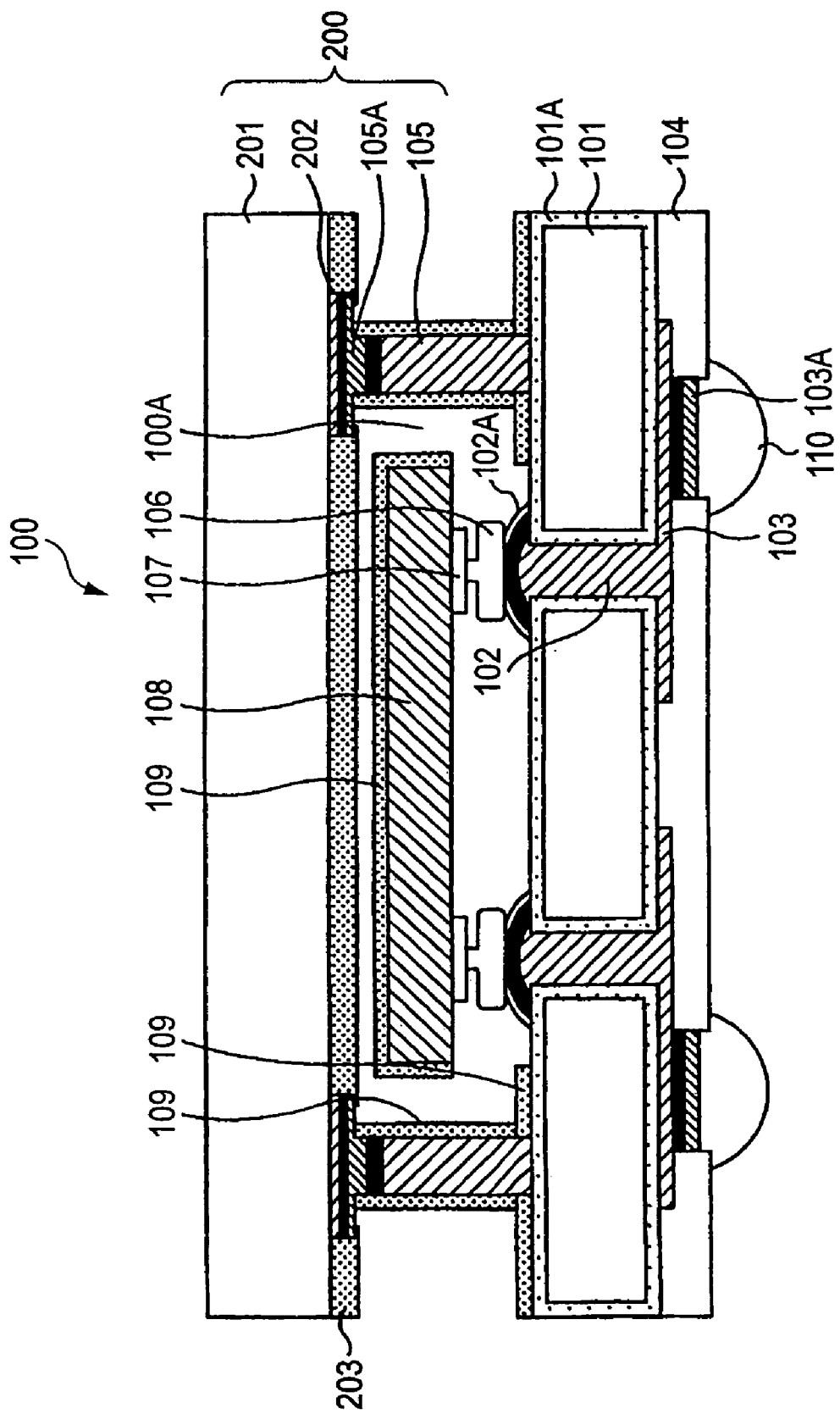
FIG. 2 is a diagram illustrating the semiconductor device according to a first embodiment.

FIG. 2 illustrates a semiconductor device 100 in accordance with a first exemplary embodiment of the present invention. The semiconductor device comprises a substrate 101, a light emitting element 108 mounted on the substrate 101 by flip chip bonding and a sealing structure 200 sealing the light emitting element 108.

Further, the sealing structure 200 includes a blocking portion 105 which is formed to surround the light emitting element 108 on the substrate 101 through plating and is bonded to a cover portion 201 which is arranged on top of the blocking portion 105. Furthermore, phosphor films 109, 203 are formed on an internal surface of the sealing structure 200 and the blocking portion 105 functions as a reflector that reflects a light emitted from the light emitting element 108.

For example, it is preferable that the light emitting element is sealed either in decompression space or in sealed space replaced by inert gas. In this case, the light emitting element has a longer lifetime as well as stability in emitting light.

In the semiconductor device 100 in accordance with the first exemplary embodiment of the present invention, the light emitting element 108 is made to be mounted on the substrate 101 by flip chip bonding and is made to be sealed in internal space 100A formed inside the sealing structure 200. For this reason, it is easy to minimize the size of the high-performance semiconductor device in which the light emitting element is made to be sealed.

Furthermore, the blocking portion 105 which is formed through plating of metal (such as Cu) makes up a part of the sealing structure 200, and also functions as a reflector that reflects a light emitted from the light emitting element 108. It is thus possible to downsize the semiconductor device and also to improve light emitting efficiency.

In the semiconductor device as described above, an internal surface of the sealing structure 200 is coated with the phosphor films 109, 203 which emit light in response to the emission of the light emitting element 108. Thus, the semiconductor device can easily obtain the desired light emitting color. In addition, it is possible to improve the light emitting efficiency of the light emitting color. For example, the phosphor film 109 is formed on the light emitting element 108, and is also formed on the substrate 101 and the blocking portion 105 within the sealed space 100A. Further, the phosphor film 203 is formed on the surface of the cover portion 201, which is opposed to the side of the sealed space 100A.

Further, by forming the phosphor film on the internal surface of the sealing structure 200, the light emitted from the light emitting element 108 necessarily transmits into the phosphor film. As a result, it is possible to achieve an effect of improving light emitting color and uniformity of light emitting efficiency.

The structure of the light emitting element 108 is connected to a via plug 102 (a through wiring) that is formed to pass through the substrate 101. For this reason, the light emitting element 108 is simply connected to an object to be connected to the light emitting element 108 (such as motherboard) and it is possible to downsize the semiconductor device. A connection layer 102A made of, for example, Ni/Au is formed on the via plug 102. Further, a bump 106 (such as Au bump, which is formed by wire-bonding of Au wire) is formed on the connection layer 102A. In addition, the connection layer 102A comprises a two-layered plated layer, the surface of which is made of Au. A connection pad 107 formed on the light emitting element 108 is connected with the via plug 102 through the bump 106 and connection layer 102A.

Further, a wiring pattern 103 connected with the via plug 102 is formed on the opposite side (back side) of the substrate 101 mounted with the light emitting element 108 on front side. Furthermore, a solder resist layer 104 covering the substrate 101 and the wiring pattern 103 is formed in such a condition that a part of the wiring pattern 103 is exposed.

A connection layer 103A made of, for example, Ni/Au (two-layered plated layer, the surface of which is made of Au) is formed on the wiring pattern 103 exposed from the solder resist layer 104. Further, when this semiconductor device is used as a Ball Grid Array (BGA) type semiconductor device, a solder bump 110 (solder ball) is formed on the connection layer 103A. The other side of the solder bump 110 is electrically connected with a connection object such as a motherboard.

When the blocking portion 105 is bonded to the cover portion 201, a connection layer may be set between the blocking portion 105 and the cover portion 201 to improve the connection between the blocking portion 105 and the cover portion 201. A connection layer 105A made of, for example, Ni/Au (two-layered plated layer, the surface of which is made of Au) is formed on the blocking portion 105. A connection layer 202 made of, for example, Cu/Ni/Au (three-layered plated layer, the surface of which is made of Au) is formed on part of the cover portion 201, which is in contact with the blocking portion 105, by patterning.

An insulator film 101A is formed on the surface of the substrate 101. Thus, both the via plug 102 and the wiring pattern 103 are insulated from the substrate 101.

In addition, when the substrate 101 is made of an insulator such as glass, ceramic and plastic, the insulator film 101A is not necessary.

In the semiconductor device 100 as described above, the substrate 101 may be made of, for example, Si and the insulator film 101A may be made of $SiO_2$. The blocking portion 105, the via plug 102 and the wiring pattern 103 are made of, for example, Cu. However, they are not limited to these materials.

Next, based on FIG. 3A to FIG. 3Q, an exemplary embodiment of a method for manufacturing the semiconductor device 100 will be described in order.

Figure 3A:
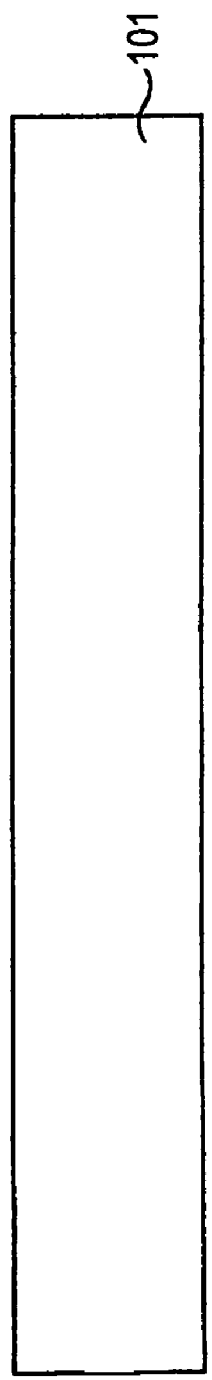
FIG. 3A is a diagram illustrating a first process step for fabricating the semiconductor device shown in FIG. 2.

Firstly, in the step as shown in FIG. 3A, a substrate 101 for example, made of Si (Si wafer) is provided.

Figure 3B:
FIG. 3B is a diagram illustrating a second process step for fabricating the semiconductor device shown in FIG. 2.

Next, in the step as shown in FIG. 3B, the substrate 101 is thinned by grinding (back grinding), so the thickness of the substrate 101 becomes approximately 200 μm.

Next, in the step as shown in FIG. 3C, a via hole 101a is formed on the substrate 101. Regarding a step of forming the via hole 101a, firstly, a resist is coated on the substrate 101 and the resist is patterned through exposure and development. Next, by using the patterned resist as a mask, the via hole 101a is formed by Reactive Ion Etching (RIE), for example. After the via hole 101a is formed, the resist is removed.

Next, in the step as shown in FIG. 3D, an insulator film 101A made of silicon dioxide film is formed by oxidizing the surface of the substrate 101, which includes the internal surface of the via hole 101a.

Figure 3E:
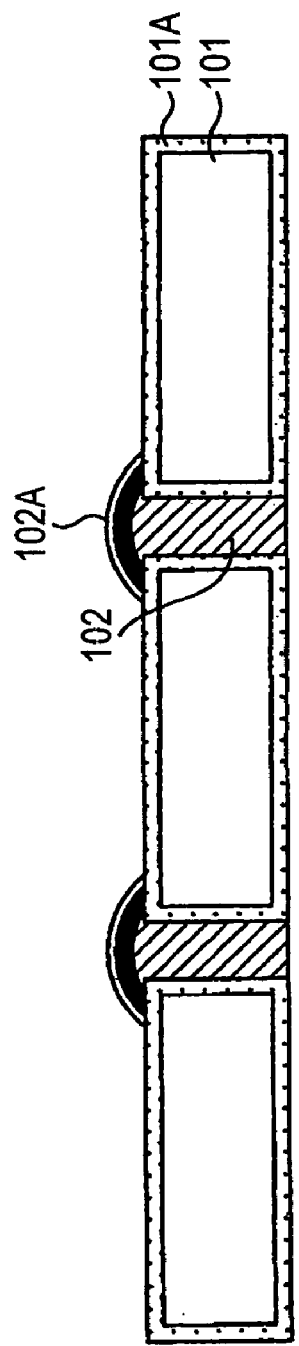
FIG. 3E is a diagram illustrating a fifth process step for fabricating the semiconductor device shown in FIG. 2.

Next, in the step as shown in FIG. 3E, a via plug 102 is formed in the via hole 101a and a connection layer 102A made of, for example, Ni/Au is formed on the via plug 102 through plating, for example. Regarding the plating as described above, firstly, a seed layer (e.g. feeding layer not shown) is formed on the surface of the insulator film 101A through electroless Cu plating or sputtering, and the via plug 102 and the connection layer 102A are formed on the seed layer through electrolytic plating. Then, an unnecessary portion of the seed layer is removed by etching.

Figure 3F:
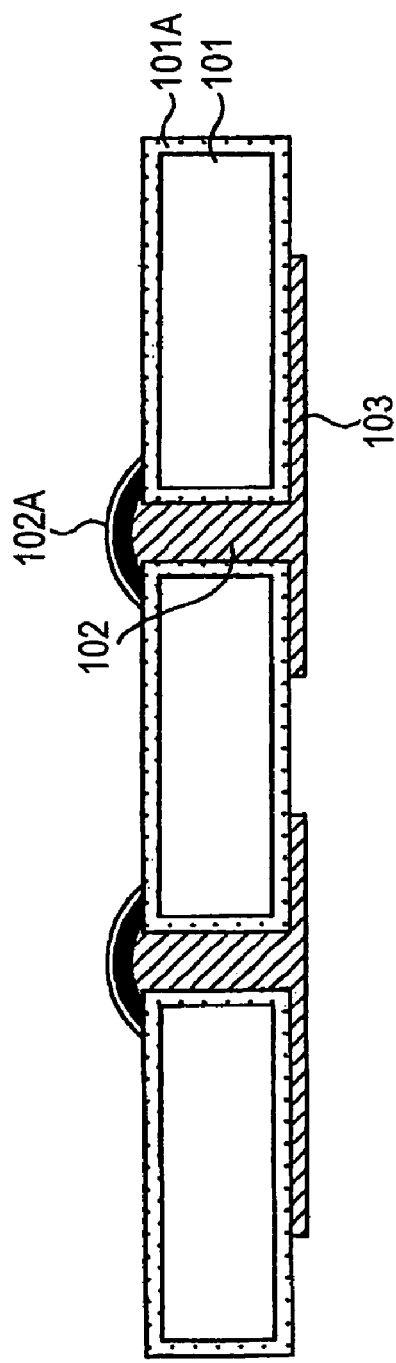
FIG. 3F is a diagram illustrating a sixth process step for fabricating the semiconductor device shown in FIG. 2.

Next, in the step as shown in FIG. 3F, a wiring pattern 103 connected to the via plug 102 is formed on the backside of the substrate 101 (the opposite side of side on which the connection layer 102A is formed) through plating, for example.

Regarding a step of forming the wiring pattern 103, firstly, the seed layer (not shown) is formed on the surface of the insulator film 101A through electroless Cu plating or sputtering, and a resist pattern (not shown) which is patterned by using a photolithography method is formed on the seed layer. Then, by using the resist pattern as mask, the wiring pattern 103 is formed through electrolytic plating, and the resist pattern is removed. Further, the seed layer, which is exposed by removing the resist pattern, is removed by etching.

Next, in the step as shown in FIG. 3G, a solder resist layer 104 is formed on the backside of the substrate 101, so that a part of the wiring pattern 103 remains exposed. Then, connection layer 103A made of Ni/Au is formed on the exposed wiring pattern 103 through electroless plating, for example.

Next, in the step as shown in FIG. 3H, a blocking portion 105 is formed on the substrate 101 (on the insulator film 101A) through plating. Regarding the formation of the blocking portion 105, firstly, a seed layer (not shown) is formed on the insulator film 101A through electroless Cu plating or sputtering, and a resist pattern (not shown) which is patterned by using a photolithography method is formed on the seed layer.

Then, by using the resist pattern as a mask, the blocking portion 105 made of Cu is formed through electrolytic plating, and a connection layer 105A made of Ni/Au (two-layered plated layer, the surface of which is made of Au) is formed on the blocking portion 105, and the resist pattern is removed. Further, the seed layer, which is exposed by removing the resist pattern, is removed by etching.

Figure 3I:
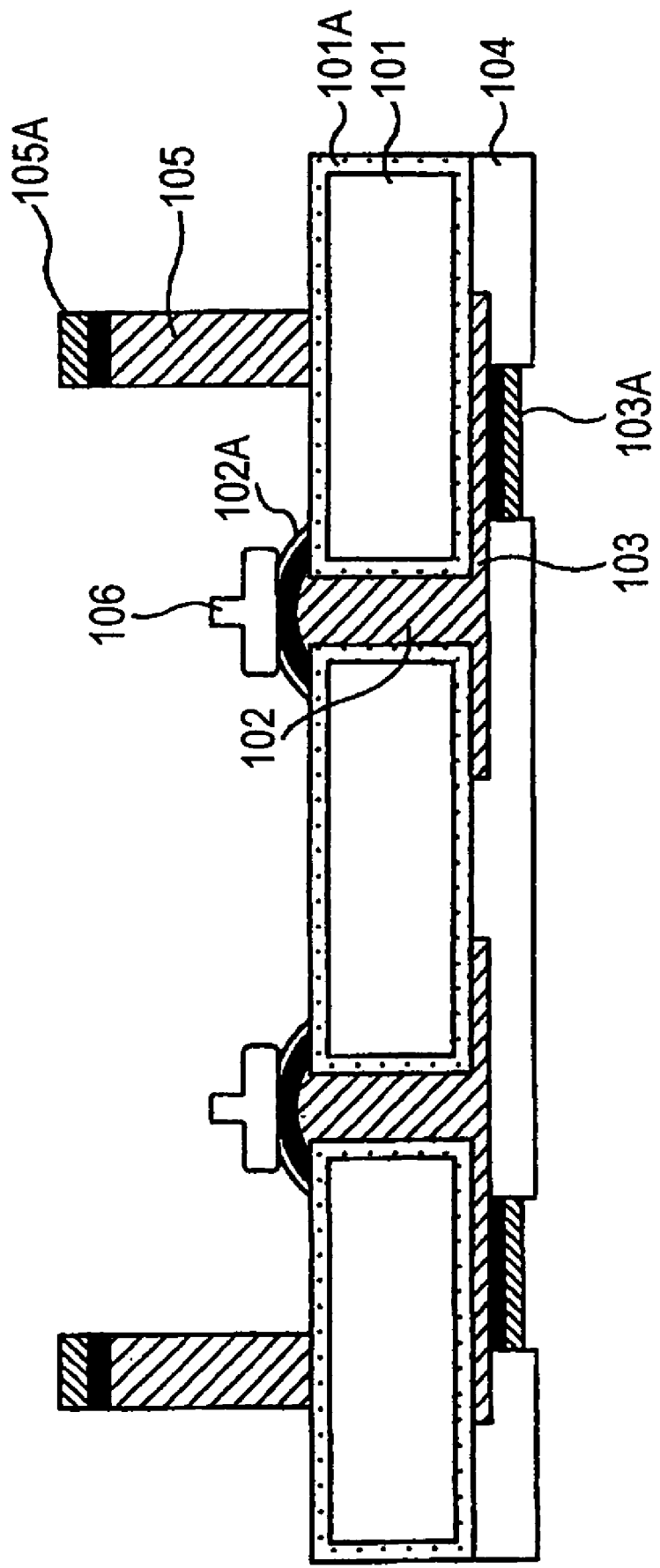
FIG. 3I is a diagram illustrating a ninth process step for fabricating the semiconductor device shown in FIG. 2.

Next, in the step as shown in FIG. 3I, a bump 106 such as Au bump is placed on the connection layer 102A.

Next, in the step as shown in FIG. 3J, a light emitting element 108 such as an LED is mounted by flip chip bonding in a region surrounded by the blocking portion 105, so that the light emitting element 108 can be connected to the via plug 102 through the bump 106 (and the connection layer 102A). In this case, by using ultrasonic waves, the bump 106 is bonded to a connection pad 107, which is formed on the light emitting element 108 and is made of Au or Al, for example.

Figure 3K:
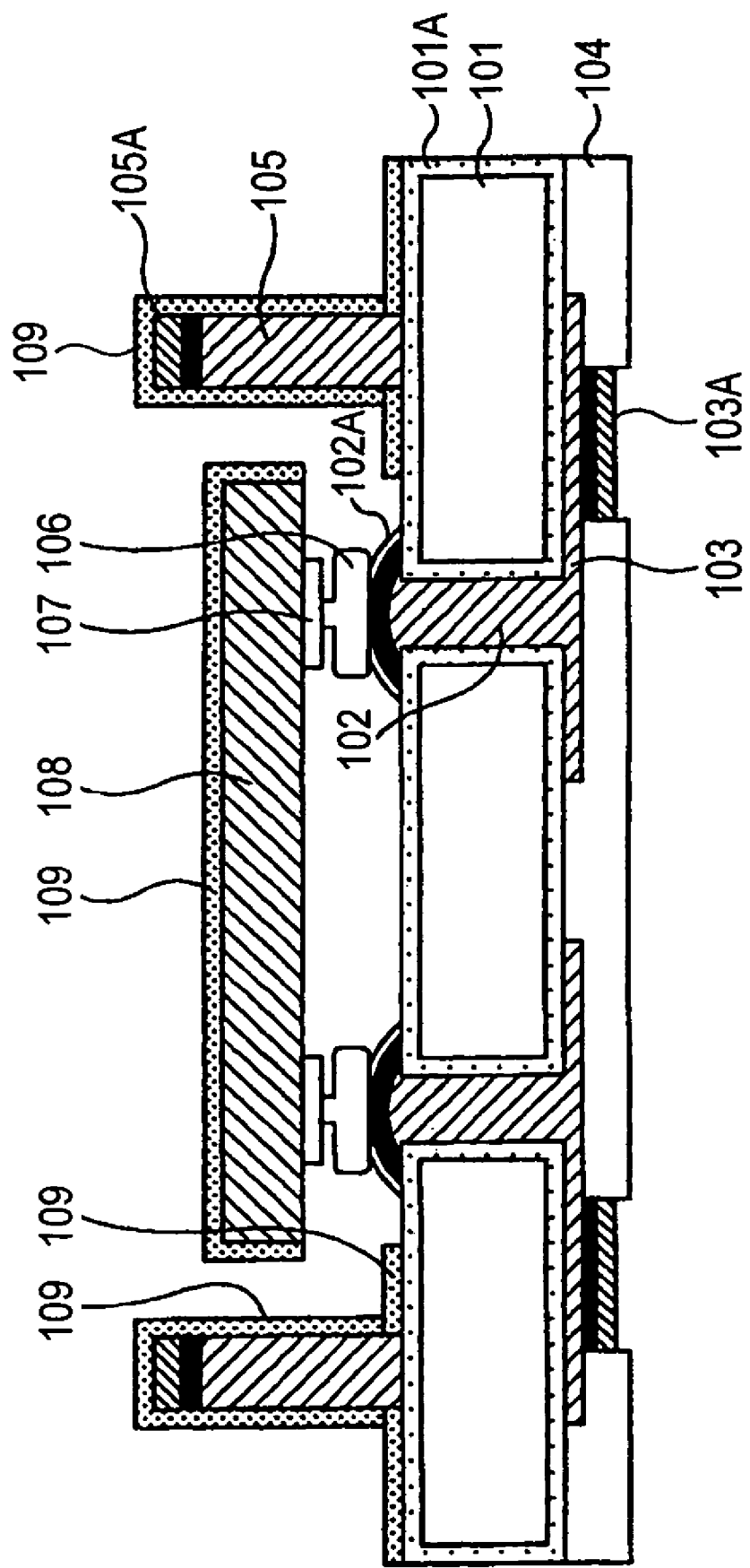
FIG. 3K is a diagram illustrating an eleventh process step for fabricating the semiconductor device shown in FIG. 2.

Next, in the step as shown in FIG. 3K, a phosphor film 109 is formed on the light emitting element 108. The phosphor film 109 is also formed, for example, by using a spray coater, on the blocking portion 105 (a top the connection layer 105A) as well as on the substrate 101 (a top the insulator film 101A). Further, in this step, there may be no problem even if the phosphor film 109 is not formed on the light emitting element 108.

Figure 3L:
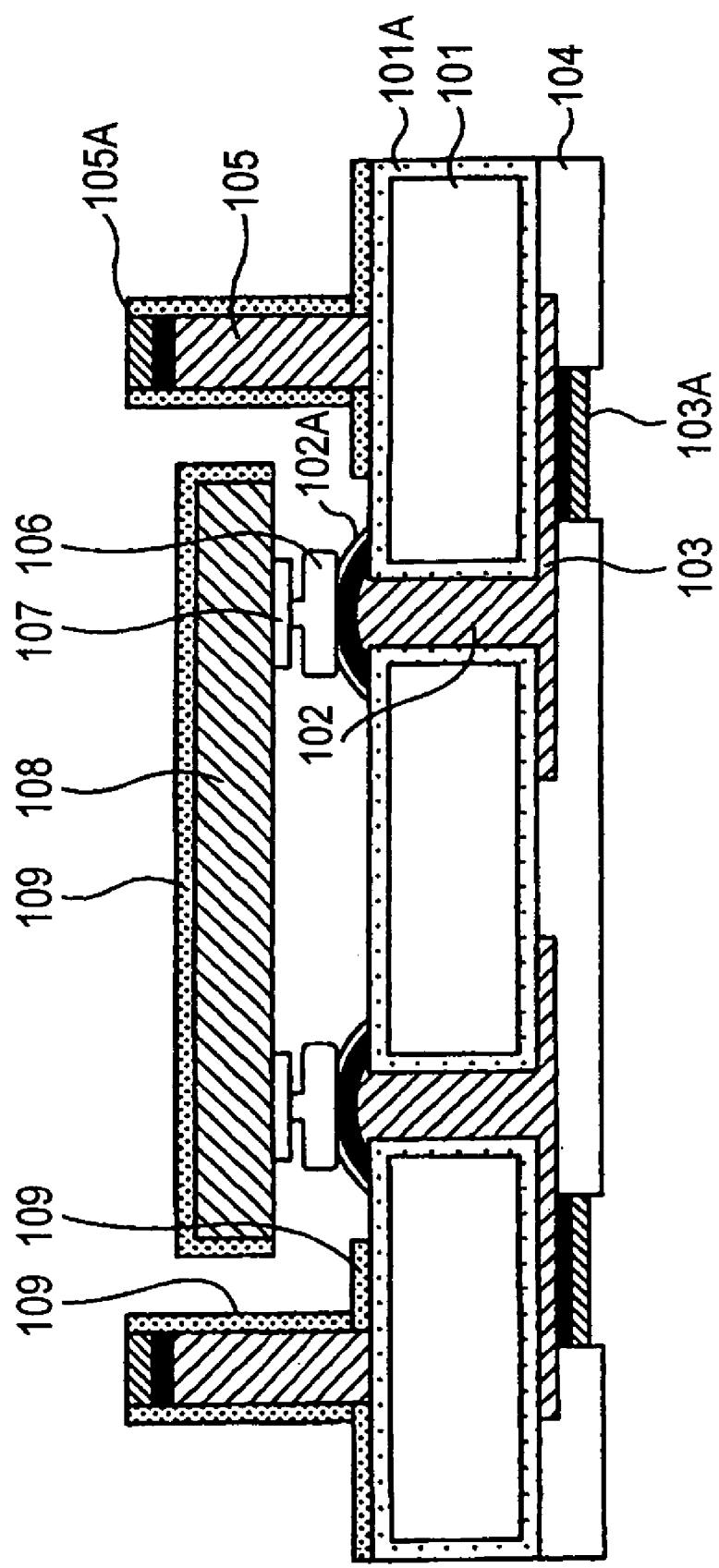
FIG. 3L is a diagram illustrating a twelfth process step for fabricating the semiconductor device shown in FIG. 2.

Next, in the step as shown in FIG. 3L, the phosphor film formed on the connection layer 105A is removed by grinding so that the connection layer 105A can be exposed.

Next, in the step as shown in FIG. 3M to FIG. 3P, the cover portion 201, which constitutes a sealing structure with the above-described blocking portion 105, is formed.

Figure 3M:
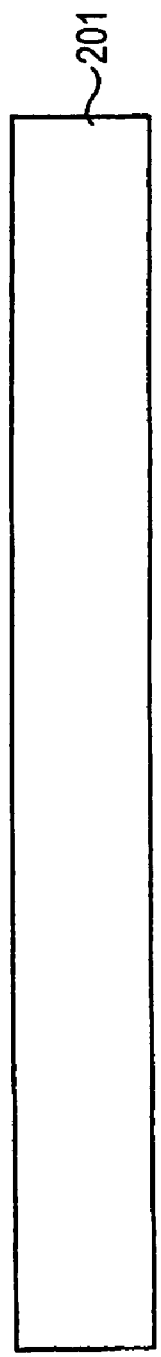
FIG. 3M is a diagram illustrating a thirteenth process step for fabricating the semiconductor device shown in FIG. 2.

Firstly, in the step as shown in FIG. 3M, a cover portion 201 such as glass substrate is provided.

Figure 3N:
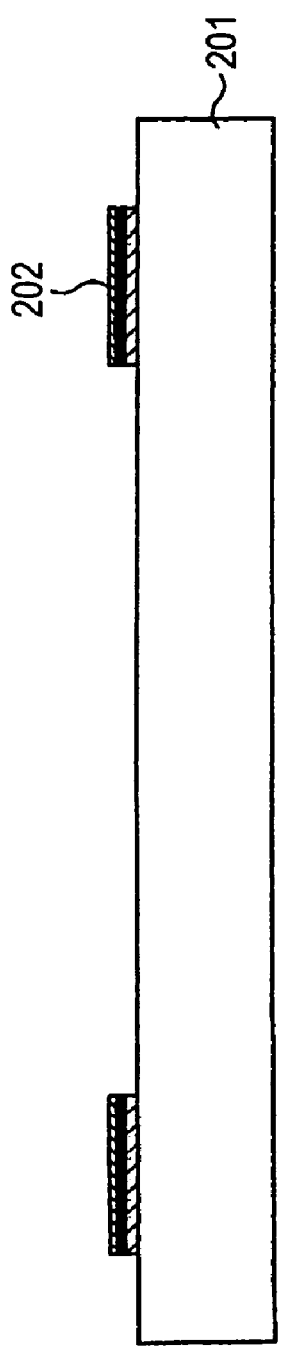
FIG. 3N is a diagram illustrating a fourteenth process step for fabricating the semiconductor device shown in FIG. 2.

Next, in the step as shown in FIG. 3N, a connection layer 202 is formed by patterning on the cover portion 201. Regarding the formation of the connection layer 202, firstly, a seed layer (not shown) is formed on the surface of the cover portion 201 through electroless Cu plating or sputtering, and a resist pattern (not shown) which is patterned by using a photolithography method is formed on the seed layer. Then, by using the resist pattern as a mask, the connection layer 202 made of Cu/Ni/Au, for example (three-layered plated layer, the connection face of which is made of Au) is formed through electrolytic plating, and the resist pattern is removed. The seed layer, which is exposed by removing the resist pattern, is removed by etching.

Figure 3O:
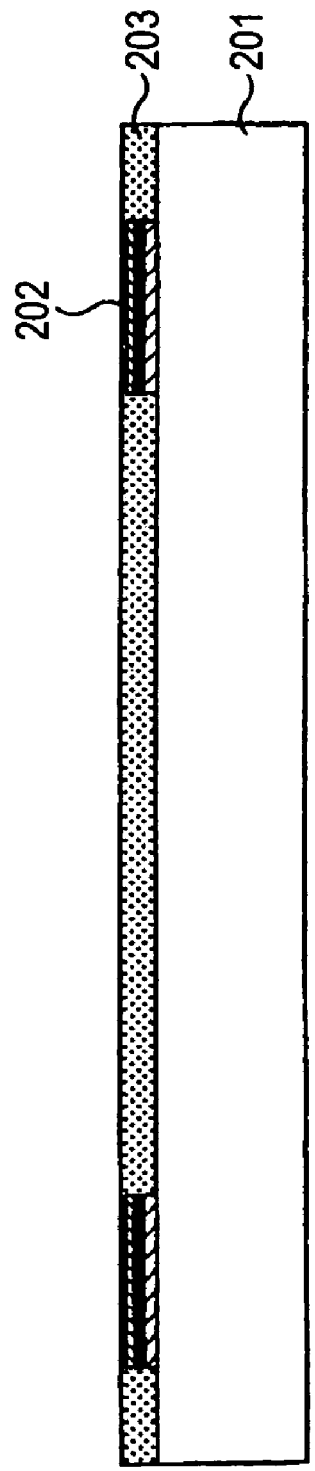
FIG. 3O is a diagram illustrating a fifteenth process step for fabricating the semiconductor device shown in FIG. 2.

Next, in the step as shown in FIG. 3O, by using printing or spray coating, a phosphor film 203 is formed on the cover portion 201 so as to cover the connection layer 202.

Figure 3P:
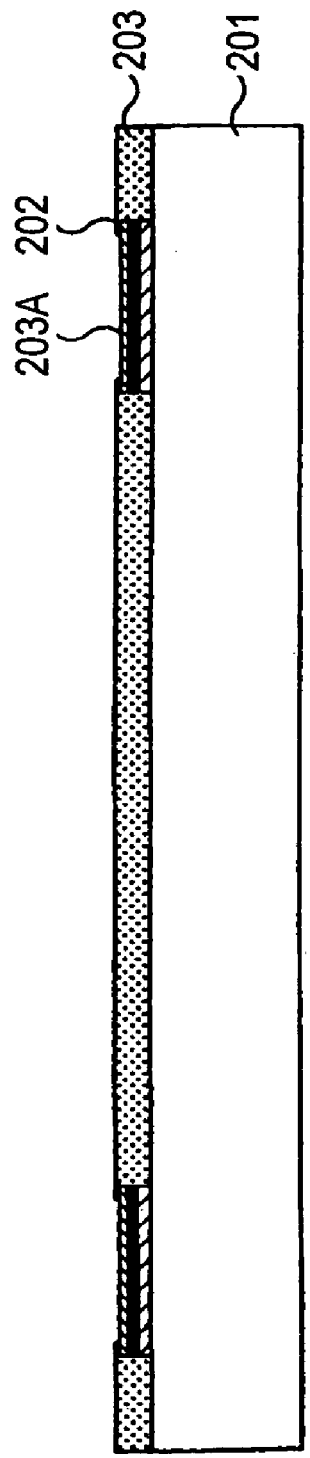
FIG. 3P is a diagram illustrating a sixteenth process step for fabricating the semiconductor device shown in FIG. 2.

Next, in the step as shown in FIG. 3P, the phosphor film 203 on the connection layer 202 is removed. Regarding a step of removing the phosphor film 203, firstly, a resist pattern (not shown), which is patterned by using a photolithography method, is formed on the phosphor film 203. Then, by using the resist pattern as a mask, plasma ashing is implemented so that the phosphor film 203 on the connection layer 202 can be removed and an opening 203A can be formed. Then, the resist pattern is removed.

Figure 3Q:
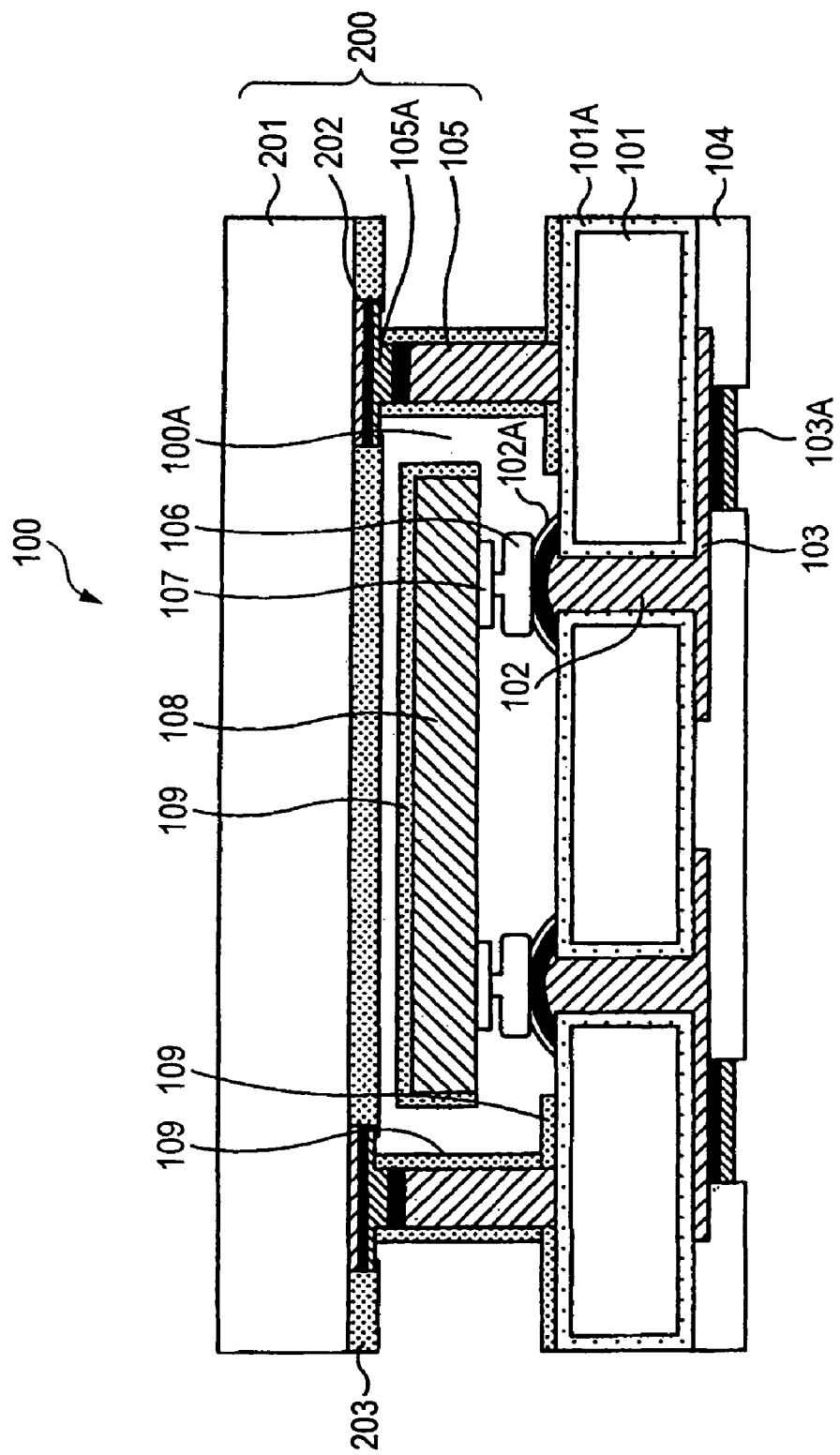
FIG. 3Q is a diagram illustrating a seventeenth process step for fabricating the semiconductor device shown in FIG. 2.

Next, in the step as shown in FIG. 3Q, the cover portion 201 as shown in FIG. 3P is bonded to the blocking portion 105 on the substrate 101 mounted with the light emitting element 108 as shown in FIG. 3L.

In this case, Au of the connection layer 202 is bonded to Au of the connection layer 105A by ultrasonic bonding. As a result, a sealing structure 200 comprises the blocking portion 105 and the cover portion 201 (connected through the connection layers 105A, 202). The light emitting element 108 is sealed in the internal space 100A which is formed by the substrate 101 and the sealing structure 200.

Figure 3R:
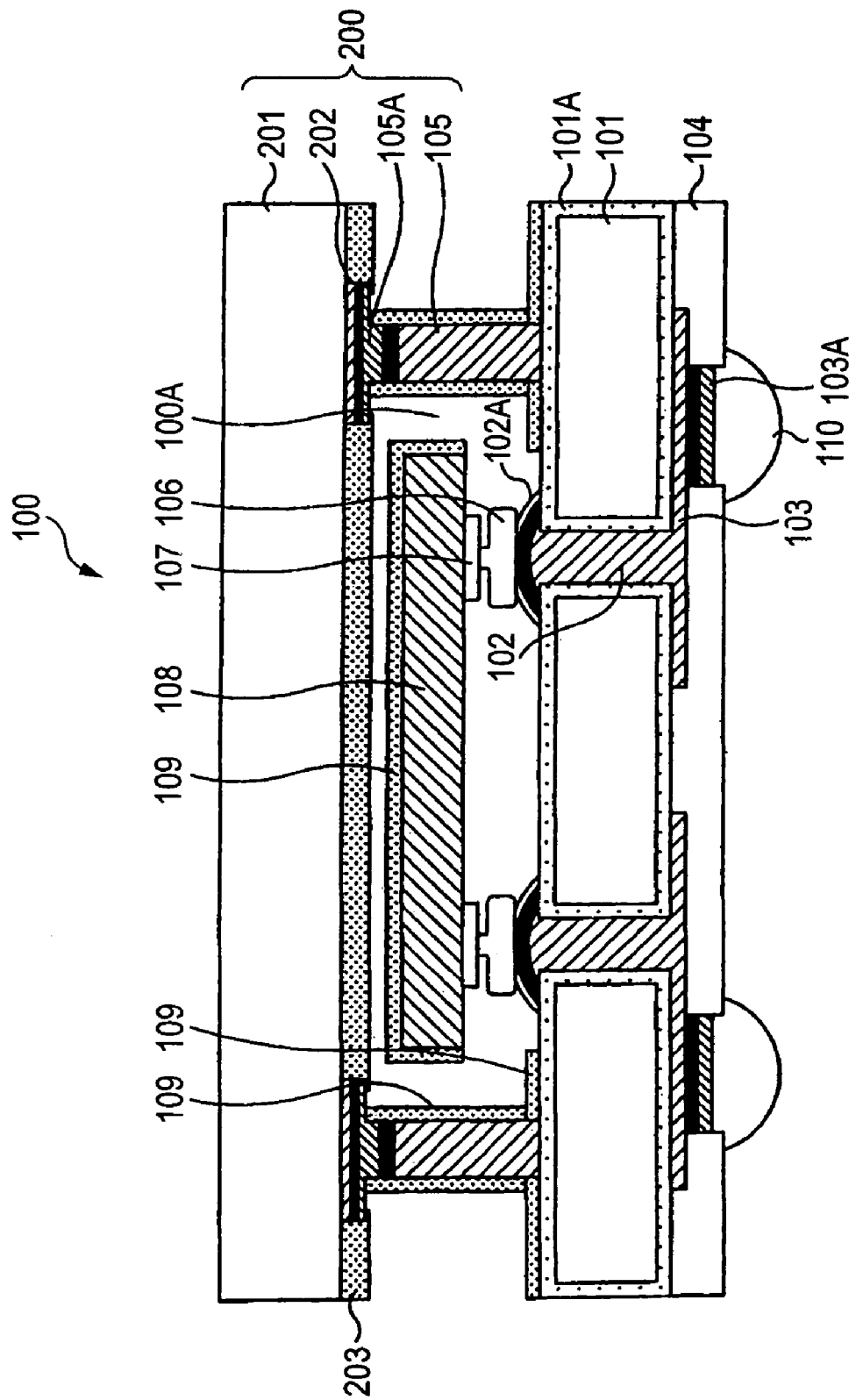
FIG. 3R is a diagram illustrating an eighteenth process step for fabricating the semiconductor device shown in FIG. 2.

Next, in the step as shown in FIG. 3R, if necessary, a solder ball 110 is formed on the connection layer 103A. However, it is possible to skip the formation of the solder ball 110.

Further, in FIG. 3A to FIG. 3R as described above, only the formation of one semiconductor device has been discussed. However, it is possible to form a plurality of semiconductor devices by using the substrate 101 and the cover portion 201. In this case, for example, a plurality of semiconductor devices may be divided into separate semiconductor devices by dicing the substrate 101 and the cover portion 201 in this step.

Thus, it is possible to form the semiconductor device 100 according to an exemplary embodiment of the present invention.

In the process step as described above, there is provided a feature to form the sealing structure 200 easily. For example, the blocking portion 105 can be easily formed because it is formed through plating. Further, it is possible to form a plurality of blocking portions 105 on the substrate 101 at the same time (formation in the wafer level). Therefore, there is provided a feature of mass-producing semiconductor devices easily. In addition, it is possible to use a metal which is formed through plating, for example Cu, as a reflector that reflects a light emitted from the light emitting element 108. Therefore, in the process step as described above, it is possible to form a reflector and a sealing structure at the same time.

Further, phosphor films can be easily formed because the phosphor films 109, 203 are formed on the internal surface of the sealing structure 200 through a method such as spray coating. Further, in the case of obtaining mixed light emitting a color obtained from light emitted from the phosphor films and light emitted from light emitting element 108, there is provided a feature of improved uniformity of the blended light emitting color.

Further, before the light emitting element 108 is mounted, the via plug 102 is formed to pass through the substrate 101 to be connected to the light emitting element 108. Thus, it is possible to manufacture the semiconductor device so that the light emitting element 108 can be easily connected to a connection object (such as a motherboard).

Further, material for forming the semiconductor device 100 according to an exemplary embodiment of the present invention is not limited to that as described above, and it is possible to form the semiconductor device 100 by using various materials. For example, by using Si which is formed on the connection layer 105A through sputtering and by adopting structure in which the connection layer 202 is cut out, it is possible to connect the connection layer 105A with a cover portion 201 made of glass through anodic bonding.

Further, by alternatively forming the blocking portion 105 and the connection layer 105A on the cover portion 201 and by forming the connection layer 202 on the substrate 101, the cover portion 201 may be connected to the substrate 101.

In the process step of the semiconductor device as described above, it is possible to form the semiconductor device by using a substrate and cover portion of varied sizes. For example, four methods are described below.

In a first method, the semiconductor device is formed by connecting each of substrates 101 with each of the cover portions 201.

In a second method of obtaining the semiconductor device, a plurality of substrates 101 are formed on a large-sized substrate, and the substrates 101 on the large-sized substrate are connected to each of the respective cover portions 201. Subsequently, the large-sized substrate is cut into separate substrates 101.

In a third method of obtaining the semiconductor device, a plurality of cover portions 201 are formed on a large-sized substrate, and the cover portions 201 on the large-sized substrate are connected to each of the respective substrates 101. Subsequently, the large-sized substrate is cut into separate cover portions 201.

In a fourth method of obtaining the semiconductor device, a plurality of substrates 101 are formed on a first large-sized substrate, and a plurality of cover portions 201 are formed on a second large-sized substrate. Next, the first large-sized substrate is connected to the second large-sized substrate, and the substrates 101 on the first large-sized substrate are connected to the respective cover portions 201 on the second large-sized substrate. Next, the first large-sized substrate and the second large-sized substrate, which are connected each other, are cut so that substrates 101 and cover portions 201 are separated respectively.

Although exemplary embodiments of the present invention have been described above, the present invention is not limited to these specific embodiments, and various variations and modifications may be made without departing from the scope of the present invention.

According to the present invention, it is possible to provide a semiconductor device mounted with a light emitting element, which can be downsized easily, improve light emitting efficiency and be formed easily, and a method for manufacturing the semiconductor device effectively.

What is claimed is:

1. A semiconductor device comprising:
   a substrate;
   a light emitting element mounted on the substrate by flip chip bonding;
   a sealing structure sealing the light emitting element; and
   a phosphor film which is formed on an internal surface of the sealing structure,
   wherein the sealing structure includes:
      a blocking portion which is formed of an electrolytic plating film integrally with the substrate so as to surround the light emitting element on the substrate and functions as a reflector that reflects a light emitted from the light emitting element;
      a connection layer formed of an electrolytic plating film on an upper end of the blocking portion; and
      a cover portion which is arranged on top of the blocking portion and is bonded to the connection layer.

2. The semiconductor device according to claim 1, wherein the light emitting element is an LED.

3. The semiconductor device according to claim 1, further comprising:
   a through wiring passing through the substrate and is electrically connected to the light emitting element.

4. The semiconductor device according to claim 1, wherein a bonding portion of the cover portion, which is bonded to the connection layer, is formed by patterning.

5. A method for manufacturing a semiconductor device in which a light emitting element mounted on a substrate is sealed, said method comprising:
  forming a seed layer on the substrate;
  forming a resist pattern on the seed layer;
  forming a blocking portion on the seed layer exposed from the resist pattern through electrolytic plating;
  forming a connection layer on the blocking portion by electrolytic plating;
  removing the resist pattern, and then removing the seed layer which is exposed by removing the resist pattern;
  mounting the light emitting element by flip chip bonding in a region surrounded by the blocking portion on the substrate;
  coating a phosphor film on the blocking portion; and
  sealing the light emitting element by bonding a cover portion coated with phosphor film to the connection layer;
  wherein the light emitting element mounting step is performed after the blocking portion forming step.

6. The method for manufacturing the semiconductor device according to claim 5, wherein the light emitting element is an LED.

7. The method for manufacturing the semiconductor device according to claim 5, further comprising:
  coating the phosphor film on the light emitting element.

8. The method for manufacturing the semiconductor device according to claim 5, further comprising:
  forming a through wiring which is formed to pass through the substrate; and
  mounting the light emitting element so as to be connected to the through wiring.

9. The method for manufacturing the semiconductor device according to claim 5,
  wherein the blocking portion functions as a reflector that reflects a light emitted from the light emitting element.

10. The method for manufacturing the semiconductor device according to claim 5,
  wherein a bonding portion of the cover portion, which is bonded to the connection layer, is formed by patterning.

* * * * *